(12) United States Patent
Hashim et al.

(10) Patent No.: US 12,512,435 B2
(45) Date of Patent: Dec. 30, 2025

(54) SEMICONDUCTOR PACKAGE HAVING A SOLDER WETTING STRUCTURE

(71) Applicant: Infineon Technologies AG, Neubiberg (DE)

(72) Inventors: Mohd Afiz Hashim, Shah Alam (MY); Zhi Yuan Goh, Bertam (MY); Subaramaniym Senivasan, Bemban (MY); Azmil Abdullah, Merlimau (MY); Varun Parthasarathy, Johor Bahru (MY); Kah Wai Lau, Duyung (MY); Ahmad Zulkarnain Samsudin, Seremban (MY)

(73) Assignee: Infineon Technologies AG, Neubiberg (DE)

( * ) Notice: Subject to any disclaimer, the term of this patent is extended or adjusted under 35 U.S.C. 154(b) by 423 days.

(21) Appl. No.: 18/098,979

(22) Filed: Jan. 19, 2023

(65) Prior Publication Data

US 2024/0250056 A1   Jul. 25, 2024

(51) Int. Cl.
*H01L 23/00* (2006.01)
*H01L 23/31* (2006.01)
*H01L 23/495* (2006.01)

(52) U.S. Cl.
CPC .......... *H01L 24/40* (2013.01); *H01L 23/3107* (2013.01); *H01L 23/49517* (2013.01); *H01L 24/05* (2013.01); *H01L 24/48* (2013.01); *H01L 24/73* (2013.01); *H01L 2224/05005* (2013.01); *H01L 2224/40175* (2013.01); *H01L 2224/48247* (2013.01); *H01L 2224/73271* (2013.01); *H01L 2924/01029* (2013.01); *H01L 2924/014* (2013.01)

(58) Field of Classification Search
CPC ..... H01L 24/40; H01L 23/3107; H01L 24/05; H01L 24/48; H01L 24/73
See application file for complete search history.

(56) References Cited

U.S. PATENT DOCUMENTS

2007/0057373 A1* 3/2007 Okumura ................ H01L 24/32
 257/746
2015/0194373 A1 7/2015 Otremba et al.
2022/0115302 A1 4/2022 Fukatsu et al.

* cited by examiner

*Primary Examiner* — Matthew L Reames
(74) *Attorney, Agent, or Firm* — Murphy, Bilak & Homiller, PLLC

(57) ABSTRACT

A semiconductor package includes: a substrate having a metallic surface; a semiconductor die metallurgically bonded to the metallic surface of the substrate by a first solder joint; and a solder wetting structure metallurgically welded to the metallic surface of the substrate outside a perimeter of the semiconductor die and adjacent to one or more side faces of the semiconductor die. Excess solder squeezed out from under the semiconductor die is metallurgically bonded to the solder wetting structure. Methods of producing the semiconductor package and solder wetting structure are also described.

23 Claims, 7 Drawing Sheets

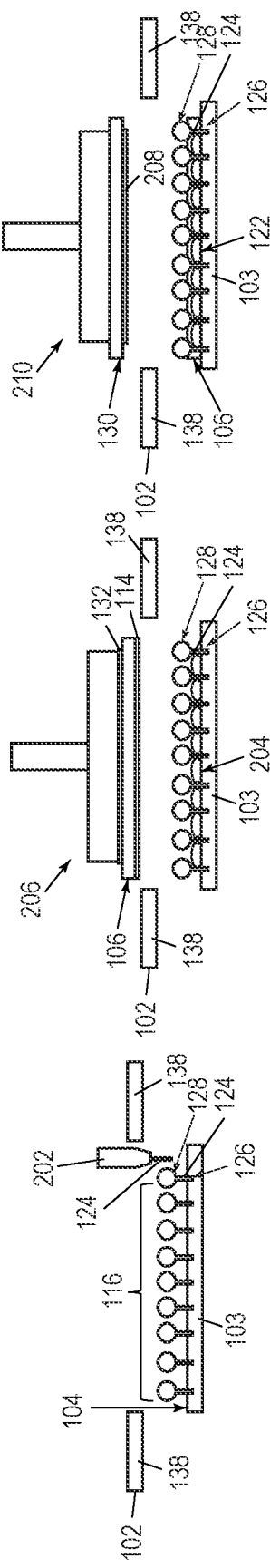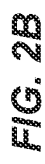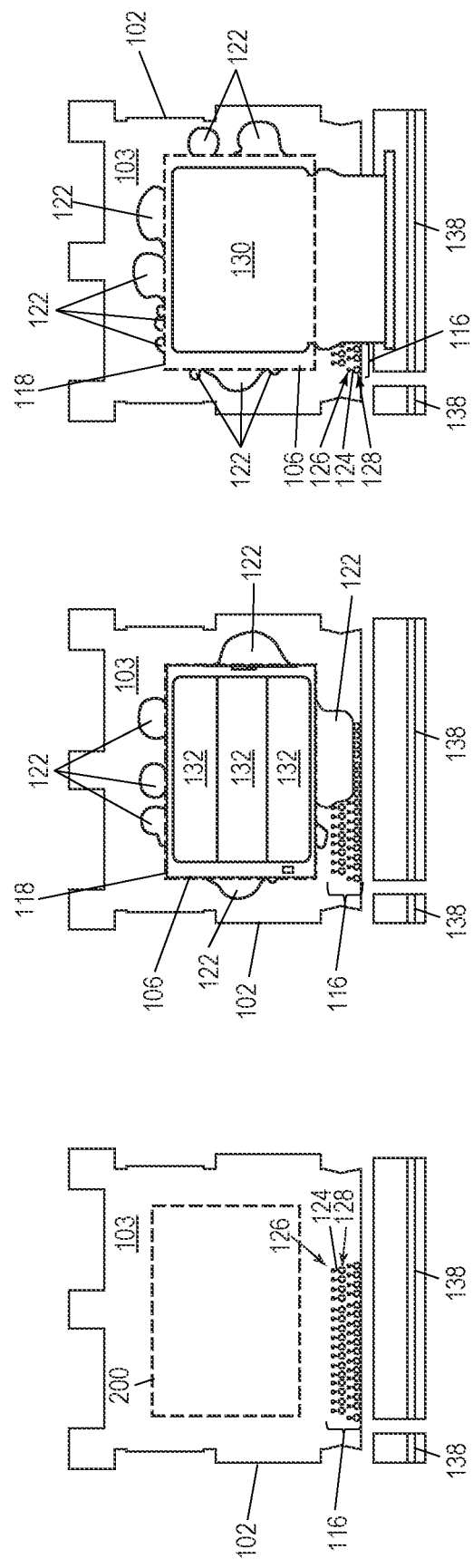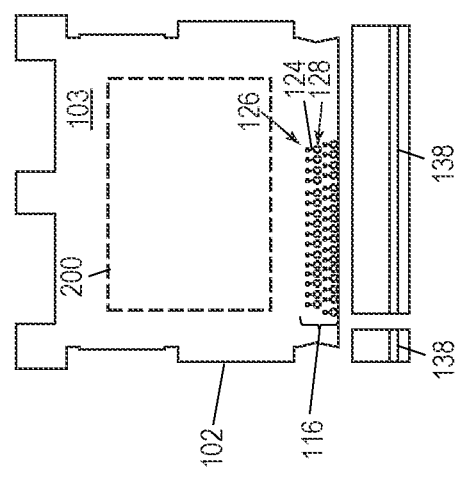

SEMICONDUCTOR PACKAGE HAVING A SOLDER WETTING STRUCTURE

BACKGROUND

Many types of semiconductor packages that include a power semiconductor die (chip) such as a power MOSFET (metal-oxide-semiconductor field-effect transistor) die, an IGBT (insulated gate bipolar transistor) die, a JFET (junction field-effect transistor) die, a HEMT (high electron mobility transistor) die, a power diode die, etc. use a conductive clip that is soldered to a contact pad at the die topside. The bottom side of the die is typically attached to a lead frame.

For flux-free solder, the die attach (to substrate) process and the clip attach (to die) process are carried out under high temperature and in multiple passes with the die attach process being performed first to attach the die to the lead frame and the clip attach process being performed after completion of the die attach process. During the clip attach process, solder that joins the power semiconductor die to the lead frame re-melts and forms a liquid which tends to flow towards the direction of an overhang between the die and the clip. Eventually, large solder bulk flows out from under the power semiconductor die and shorts to the clip since there is a high tendency for the liquid solder to flow at the clip side due to the clip overhang with the die. Thus, there is a need for an improved technique which eliminates the solder shorting.

SUMMARY

According to an embodiment of a semiconductor package, the semiconductor package comprises: a substrate having a metallic surface; a semiconductor die metallurgically bonded to the metallic surface of the substrate by a first solder joint; and a solder wetting structure metallurgically welded to the metallic surface of the substrate outside a perimeter of the semiconductor die and adjacent to one or more side faces of the semiconductor die, wherein excess solder squeezed out from under the semiconductor die is metallurgically bonded to the solder wetting structure.

According to an embodiment of a method of producing a semiconductor package, the method comprises: metallurgically welding a solder wetting structure to a metallic surface of a substrate outside a die attach area of the metallic surface; and metallurgically bonding a semiconductor die to the die attach area of the metallic surface of the substrate by a first solder joint and such that the solder wetting structure is adjacent to one or more side faces of the semiconductor die, wherein excess solder that squeezes out from under the semiconductor die during production of the semiconductor package is metallurgically bonded to the solder wetting structure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A illustrates a top perspective view of the semiconductor package prior to molding, FIG. 1B illustrates the same top perspective view but after molding, and FIG. 1C illustrates a cross-sectional view of the molded semiconductor package along the line labelled A-A' in FIGS. 1A and 1B, prior to molding.

FIGS. 2A through 2C illustrate respective cross-sectional views of an embodiment of a method of producing the semiconductor package shown in FIGS. 1A through 1C, during different stages of the production process.

FIGS. 3A through 3C illustrate corresponding top plan views during the same stages illustrated in FIGS. 2A through 2C, respectively.

DETAILED DESCRIPTION

The embodiments described herein provide a solder wetting structure that acts as a barrier against wetting of remelted solder to undesired internal regions of a semiconductor package. Excess solder that squeezes out from under a semiconductor die during package production is metallurgically bonded to the solder wetting structure, preventing the excess solder from shorting to another region such as an electrically conductive clip attached to the semiconductor die.

Described next, with reference to the figures, are exemplary embodiments of the solder wetting structure, semiconductor packages that include the solder wetting structure, and methods of producing the solder wetting structure.

Figure 1B:
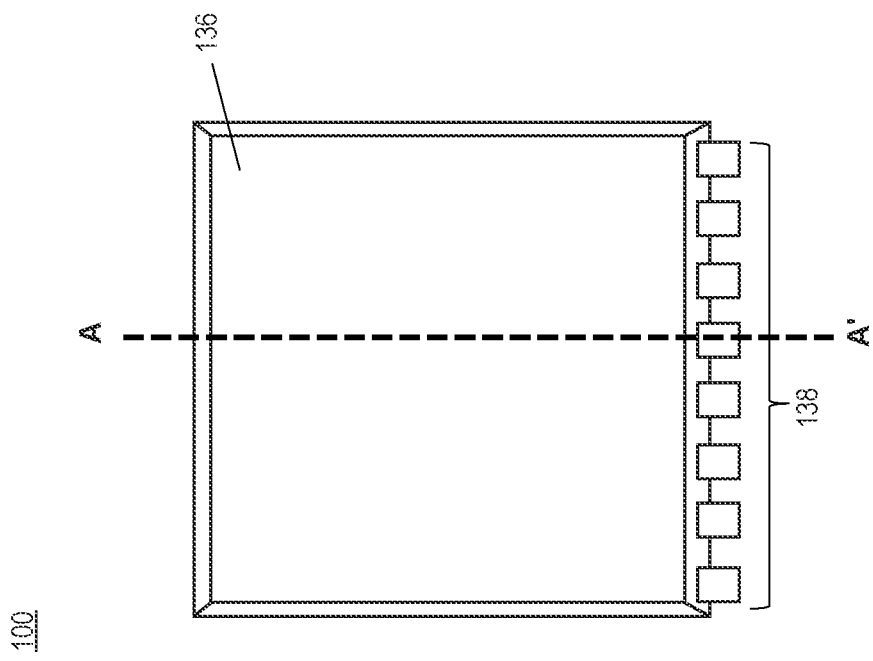
FIGS. 1A through 1C illustrate an embodiment of a molded semiconductor package having a solder wetting structure, where
Figure 1A:
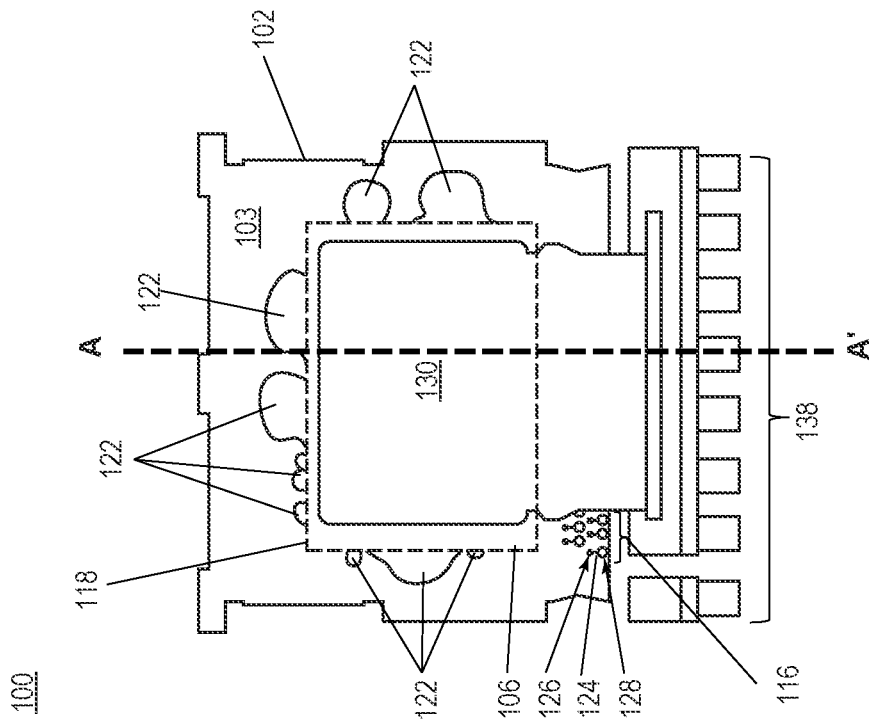
Figure 1C:
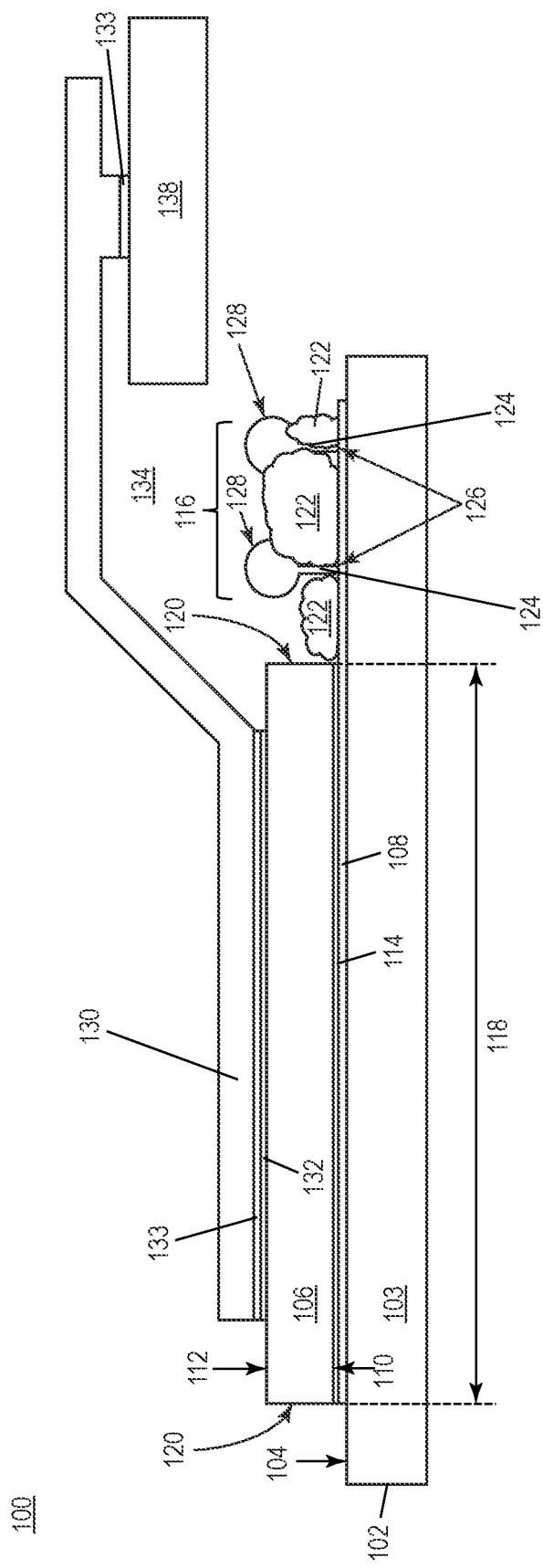

FIGS. 1A through 1C illustrate an embodiment of a molded semiconductor package 100. FIG. 1A illustrates a top perspective view of the semiconductor package 100 prior to molding. FIG. 1B illustrates the same top perspective view, but after molding. FIG. 1C illustrates a cross-sectional view of the molded semiconductor package 100 along the line labelled A-A' in FIGS. 1A and 1B, prior to molding.

The molded semiconductor package 100 includes a substrate 102 having a metallic surface 104. At least one semiconductor die 106 is metallurgically bonded to the metallic surface 104 of the substrate 102 by a first solder joint 108. The semiconductor die 106 may be a logic die such as a processor die, memory die, etc., a power semiconductor die such as a power transistor die, a power diode die, a half bridge die, etc., or a die that combines logic and power devices on the same semiconductor substrate. In one embodiment, the semiconductor die 106 is a vertical semiconductor die having a primary current path between opposing main sides 110, 112 of the die 106. Examples of vertical power semiconductor dies include but are not limited to power Si MOSFETS, IGBTs, SiC MOSFETs, GaN HEMTs, power diodes, etc. In one embodiment, the molded semiconductor package 100 is a power semiconductor package and the semiconductor die 106 is a power semiconductor die such as a Si MOSFET, IGBT, SiC MOSFET, GaN HEMT, power diode, etc. More than one semiconductor die 106 may be included in the package 100.

The substrate 102 is thermally conductive to provide a heat dissipation path for the semiconductor die 106. At least the metallic surface 104 of the substrate 102 is electrically conductive, e.g., to provide a point of electrical contact to a contact pad 114 at the bottom side 110 of the semiconductor die 106 such as a drain or collector pad in the case of the semiconductor die 106 being a vertical device. For example, the substrate 102 may be a metal substrate such as a Cu (copper) substrate. In one embodiment, the substrate 102 is a die paddle 103 of a Cu lead frame. The substrate 102 instead may be a direct bond copper (DBC) substrate, an active metal brazed (AMB) substrate, an insulated metal (IMS) substrate, etc., where the metallic surface 104 of the substrate 102 to which the semiconductor die 106 is metallurgically bonded is a metalized surface of an electrically insulative body.

The molded semiconductor package 100 also includes a solder wetting structure 116 metallurgically welded to the metallic surface 104 of the substrate 102 outside a perimeter 118 of the semiconductor die 106 and adjacent to one or more side faces 120 of the semiconductor die 106. In the case of the substrate 102 being part of a copper lead frame, the solder wetting structure 116 may comprise copper. However, other metal or metal alloys may be used for the solder wetting structure 116 such as but not limited to Ag (silver), Au (gold), Pt (platinum), etc.

Different than the metallurgical bond formed by the solder joint 108 between the semiconductor die 106 and the metallic surface 104 of the substrate 102, a metallurgical weld is formed between the solder wetting structure 116 and the metallic surface 104 of the substrate 102 without a solder joint. The metallurgy of the resulting weld depends on the composition of the metallized backside 114 of the semiconductor die 106, the composition of the metallic surface 104 of the substrate 102 (and deposited filler metal, if used), the heat input, and the welding process used. In each case, excess solder 122 that melted and squeezed out from under the semiconductor die 106 during production of the semiconductor package 100 is metallurgically bonded to the solder wetting structure 116 instead of another region of the package 100 to prevent undesired solder bridging.

The semiconductor die 106 may be metallurgically bonded to the metallic surface 104 of the substrate 102 by a flux-free solder such as PbSnAg solder wire that was melted to form the first solder joint 108. According to this embodiment, excess solder 122 that melted and squeezed out from under the semiconductor die 106 may have an inhomogeneous profile around the perimeter 118 of the semiconductor die 106, e.g., as shown in FIG. 1A. Flux-free solder such as PbSnAg solder wire has a relatively high processing/melting temperature (e.g., up to 360 C) compared to solders with flux. Such a direct high temperature attach process would normally exasperate solder bridging issues, except that the excess solder 122 that squeezed out from under the semiconductor die 106 during remelting of the first solder joint 108 is metallurgically bonded to the solder wetting structure 116 which prevents solder bridging.

In FIGS. 1A through 1C, the solder wetting structure 116 is in the form of a wire structure. For example, the solder wetting structure 116 may be implemented as a plurality of separate bond wires 124. Each separate bond wire 124 is metallurgically welded to the metallic surface 104 of the substrate 102 at a proximal tail end 126 and has an unattached distal ball end 128. In FIGS. 1A through 1C, the separate bond wires 124 are arranged in two rows along one of the side faces 120 of the semiconductor die 106. More generally, the separate bond wires 124 may be arranged in one or more rows along at least one of the side faces 120 of the semiconductor die 106.

In FIGS. 1A through 1C, the molded semiconductor package 100 also includes an electrically conductive clip 130 attached to a contact pad 132 at the frontside 112 of the semiconductor die 106 that faces away from the substrate 102, e.g., via a solder joint 133. The electrically conductive clip 130 may comprise a metal or metal alloy, e.g., such as Cu or a Cu alloy. The solder wetting structure 116 is disposed in a (vertical) gap 134 between the substrate 102 and the electrically conductive clip 130. The solder wetting structure 116 prevents the excess solder 122 from bridging the gap 134 between the substrate 102 and the electrically conductive clip 130 and is shown being adjacent only to the side face 120 of the semiconductor die 106 that faces the gap 134. However, the solder wetting structure 116 may be adjacent to at least one additional side face 120 of the semiconductor die 106. For example, the solder wetting structure 116 may be adjacent to each side face 120 of the semiconductor die 106.

In FIGS. 1A through 1C, the semiconductor package 100 also includes a mold compound 136 that encapsulates the semiconductor die 106 and at least part of the electrically conductive clip 130. Leads 138 provide points of electrical contact for the molded semiconductor package 100 and may be configured for surface mounting or through-hole mounting to a circuit board (not shown) such as a PCB (printed circuit board). Some of the package leads 138 may be electrically connected to the electrically conductive clip 130 and other ones of the leads 138 may be part of the die paddle 103. The solder wetting structure 116 may enhance locking with the mold compound 136. That is, the solder wetting structure 116 may enhance adhesion between the mold compound 136 and the metallic surface 104 of the substrate 102. Separately or in combination, the solder wetting structure 116 may be arranged along one or more sides 120 of the semiconductor die 106 that do not face the gap 134 between the substrate 102 and the electrically conductive clip 130, to prevent the excess solder 122 from shorting to a contact pad 132 such as a source or emitter pad and/or a gate pad and/or a sense pad, etc. at the frontside 112 of the semiconductor die 106.

FIGS. 2A through 2C illustrate respective cross-sectional views of an embodiment of a method of producing the semiconductor package 100 shown in FIGS. 1A through 1C, during different stages of the module production process. FIGS. 3A through 3C illustrate corresponding top plan views during the same stages illustrated in FIGS. 2A through 2C, respectively.

FIGS. 2A and 3A show the lead frame 102 before die attachment and during formation of the solder wetting structure 116. The solder wetting structure 116 is metallurgically welded to the metallic surface 104 of the substrate 102 outside a die attach area 200 of the metallic surface 104 of the substrate 102. The die attach area 200 is the area of the substrate 102 reserved for the semiconductor die 106 and corresponds to the perimeter 118 of the semiconductor die 106 shown in FIGS. 1A through 1C.

In FIGS. 2A and 3A, the solder wetting structure 116 is implemented as separate bond wires 124 each metallurgically welded to the metallic surface 104 of the substrate 102 at a proximal tail end 126 and having an unattached distal ball end 128. The separate bond wires 124 are arranged in two rows along one side faces 120 of the semiconductor die 106 in FIGS. 2A and 3A. More generally, the separate bond wires 124 may be arranged in one or more rows along one or more side faces 120 of the semiconductor die 106. FIG. 2A shows a bonding capillary 202 in the process of metallurgically welding the next bond wire 124 to the metallic surface 104 of the substrate 102.

FIGS. 2B and 3B show the die attach process. A flux-free solder 204 such as PbSnAg solder wire is applied to the die attach area 200 of the metallic surface 104 and/or to the metallized backside 114 of the semiconductor die 106. A die bond tool 206 aligns the semiconductor die 106 with the die attach area 200 of the substrate 102. The flux-free solder 204 is then melted and subsequently cooled to form a soldered joint 108 that metallurgically bonds the semiconductor die 106 to the die attach area 200 of the substrate 102.

Excess solder 122 may squeeze out from under the semiconductor die 106 during the die attach process. The excess solder 122 may have an inhomogeneous profile around the perimeter 118 of the semiconductor die 106, e.g., as shown in FIG. 3B. The excess solder 122 that squeezes out from under the semiconductor die 106 is metallurgically bonded to the solder wetting structure 116 along each side face 120 of the die 106 where the solder wetting structure 116 is present. As previously explained herein, the solder wetting structure 116 may be present along one, some, or all side faces 120 of the semiconductor die 106 and may extend over part or all of the respective side face 120.

FIGS. 2C and 3C show the clip attach process. A flux-free solder 208 such as PbSnAg solder wire is applied to a contact pad 132 at the frontside 112 of the semiconductor die 106 and/or to the bottom side of the electrically conductive clip 130. A clip bond tool 210 aligns the electrically conductive clip 130 with the frontside contact pad 132 of the semiconductor die 106. The flux-free solder 208 is then melted and subsequently cooled to form a soldered joint 133 that metallurgically bonds the electrically conductive clip 130 to the frontside contact pad 132 of the semiconductor die 106. The soldered joint 108 that metallurgically bonds the semiconductor die 106 to the die attach area 200 of the substrate 102 remelts into a liquid solder during the attaching of the electrically conductive clip 130.

As previously explained herein, the solder wetting structure 116 may be disposed in a gap 134 between the substrate 102 and the electrically conductive clip 130 such that the solder wetting structure 116 prevents the excess liquid solder 122 from bridging the gap 134 between the substrate 102 and the electrically conductive clip 130 and wetting with the electrically conductive clip 130 during the attaching of the electrically conductive clip 130 to the frontside contact pad 132 of the semiconductor die 106. The solder wetting structure 116 may be formed along one or more additional side faces 120 of the semiconductor die 106, to prevent the excess liquid solder 122 from shorting to any frontside contact pad 132 of the semiconductor die 106. The semiconductor die 106 and at least part of the electrically conductive clip 130 may be encapsulated in a mold compound 136 after the clip attach process and the solder wetting structure 116 may enhance adhesion between the mold compound 136 and the metallic surface 104 of the substrate 102, as previously explained herein.

Figure 4:
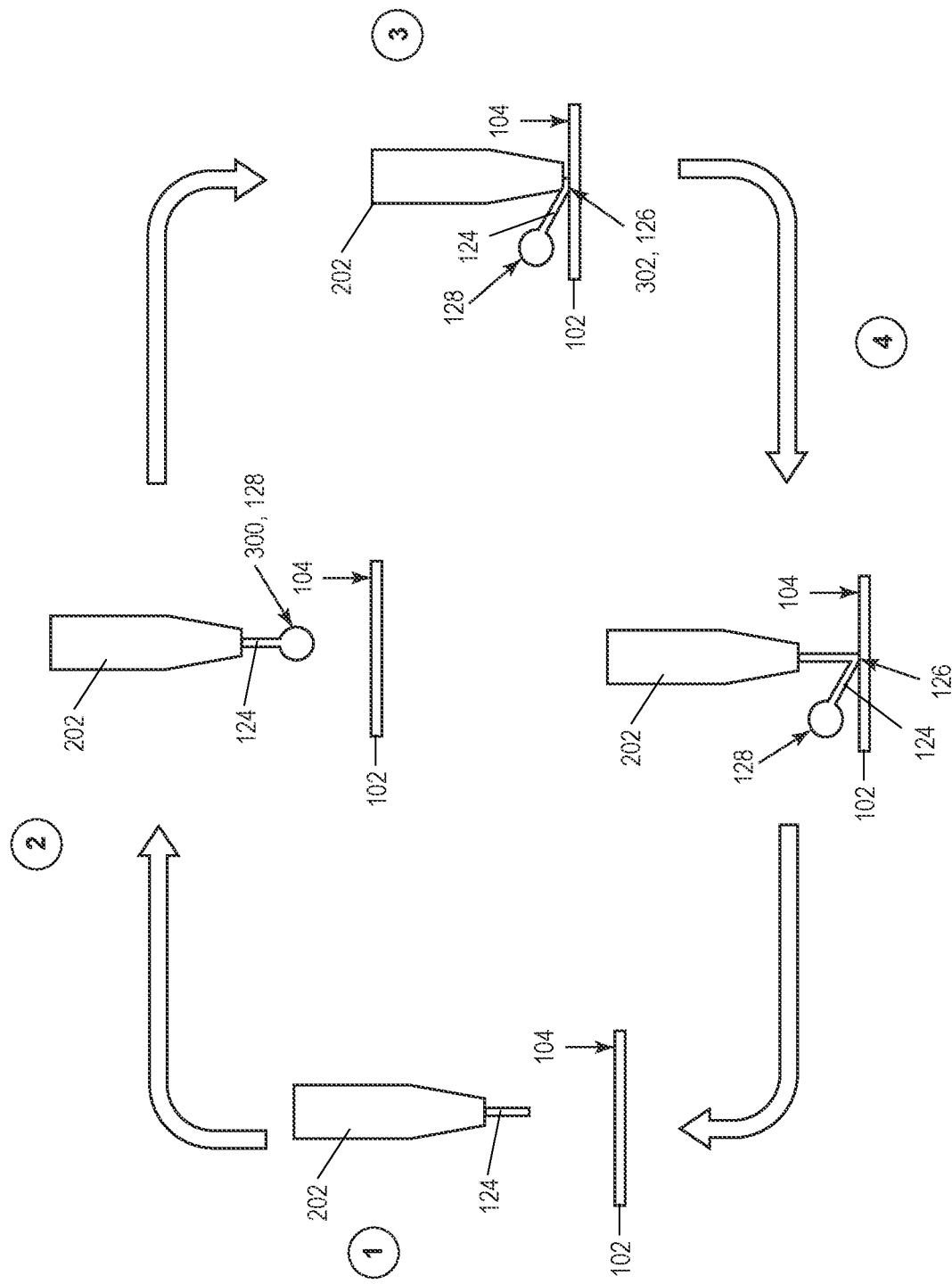
FIG. 4 illustrates an embodiment of a method of forming separate bond wires of the solder wetting structure shown in FIGS. 2A through 3C.

FIG. 4 illustrates an embodiment of a method of forming the separate bond wires 124 of the solder wetting structure 116 shown in FIGS. 2A through 3C. In a first step (1), a bond wire 124 passes through a hole in the center of the bonding capillary 202 in a direction of the metallic surface 104 of the substrate 102. In a second step (2), the end of the bond wire 124 is heated to a molten state to form a ball 300 of molten metal also known as a free-air ball at the end of the bond wire 124. The bond wire 124 is cooled without metallurgically welding the ball 300 to the substrate 102, thus forming the unattached distal ball end 128 of the bond wire 124.

In a third step (3), heat, pressure, and ultrasonic vibration are applied to the bonding capillary 202 to form a second ball that is crushed on the metallic surface 104 of the substrate 102 to form a stitch bond 302, thus forming the proximal tail end 126 of the bond wire. In a fourth step (4), the bond wire 124 is clamped and the bonding capillary 202 is raised to break the bond wire 124 and prepare for the next wire bond. The wire bonding process is repeated as indicated by the arrows in FIG. 4, to form as many separate bond wires 124 as desired. The separate bond wires 124 may be arranged in one or more rows along one or more side faces 120 of the semiconductor die 106.

Figure 5:
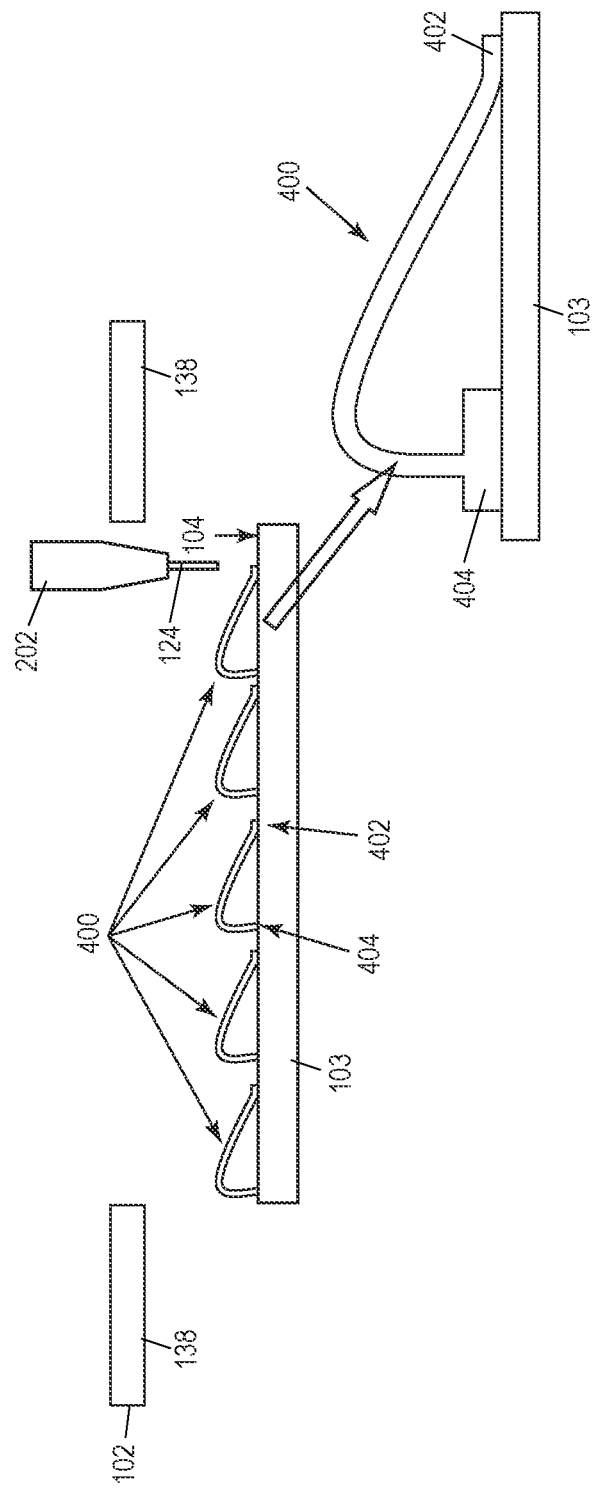
FIG. 5 illustrates another embodiment of producing the solder wetting structure.

FIG. 5 illustrates another embodiment of producing the solder wetting structure 116. According to this embodiment, the solder wetting structure 116 is implemented as separate bond wire loops 400. Each separate bond wire loop 400 has both a tail end 402 and a ball end 404 metallurgically welded to the metallic surface 104 of the substrate 102. The bonding capillary 202 forms the ball end 404 by melting the end of the bond wire 124 to form a free-air ball, placing the free-air ball into contact with the metallic surface 104 of the substrate 102, and applying heat and ultrasonic forces to the free-air ball to form a metallurgical weld between the ball and the metallic surface 104 of the substrate 102 while also allowing deformation of the ball bond into the final shape of the ball end 404. The bonding capillary 202 then runs the bond wire 124 a defined length, forms a second free-air ball at the end of the bond wire 124, and applies pressure and ultrasonic forces such that the second ball is crushed on the substrate 102 to form the tail end 402 which is in the form a stitch bond in FIG. 5. FIG. 5 provides an enlarged view of one bond wire loop 400, to emphasize the tail and ball ends 402, 404 of the bond wire loop 400.

Figure 6:
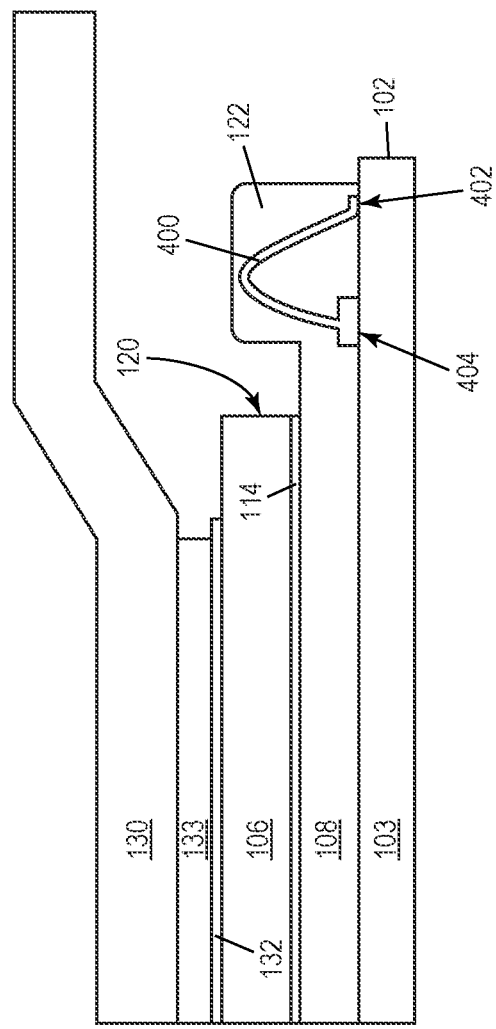
FIG. 6 illustrates a partial cross-sectional view in the region of one bond wire loop produced according to the method illustrated in FIG. 5.

FIG. 6 illustrates a partial cross-sectional view in the region of one bond wire loop 400 produced according to the method illustrated in FIG. 5. As shown in FIG. 6, excess solder 122 that melts and squeezes out from under the semiconductor die 106 during the die attach and/or clip attach processes is metallurgically bonded to the bond wire loop 400. The horizontal (x-direction) orientation of the bond wire loop 400 may be rotated, e.g., by 90 degrees such that the length of the bond wire loop 400 is in a direction that runs transverse to the lengthwise extension of the electrically conductive clip 130. The process illustrated in FIG. 5 may be used to form one or more rows of the bond wire loops 400 along one or more side faces 120 of the semiconductor die 106.

Figure 7:
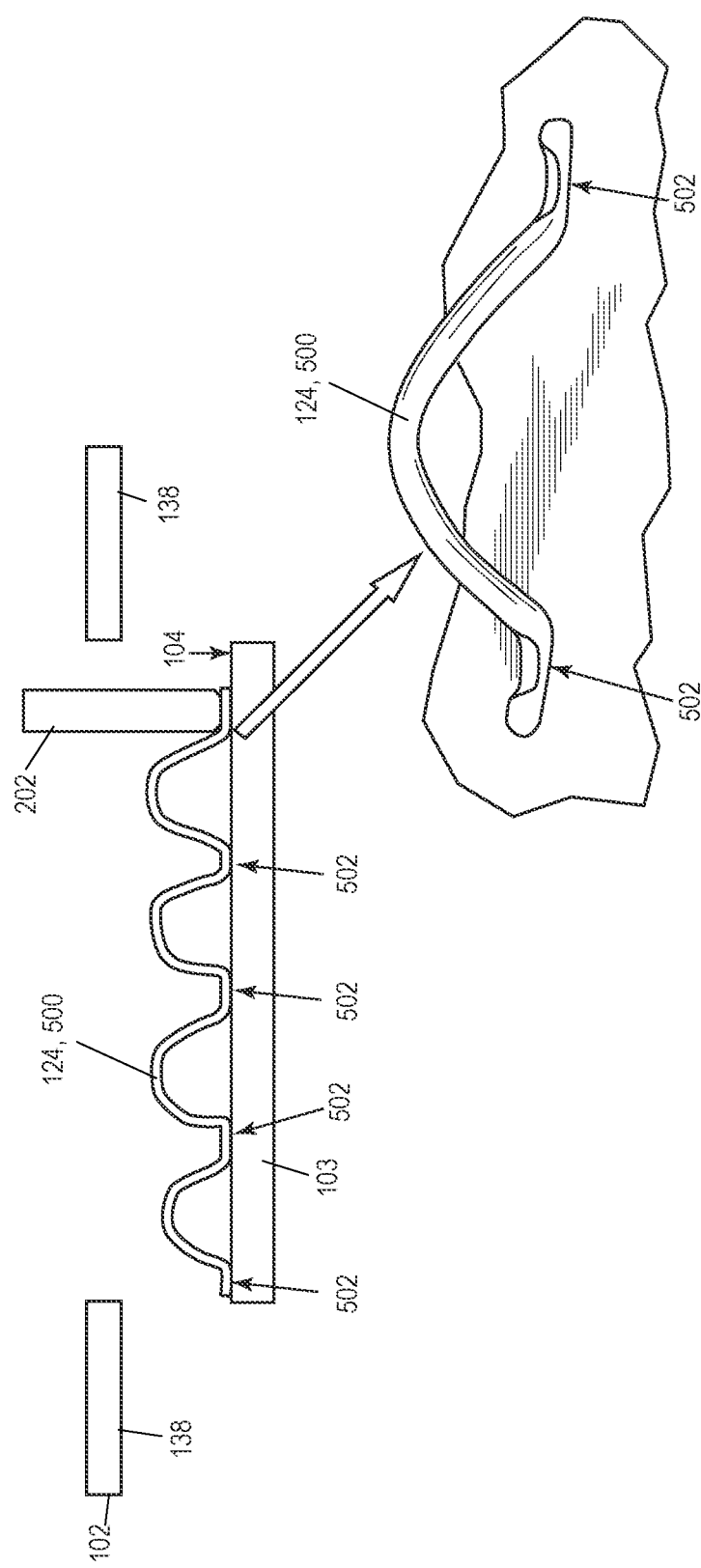
FIG. 7 illustrates another embodiment of producing the solder wetting structure.

FIG. 7 illustrates another embodiment of producing the solder wetting structure 116. According to this embodiment, the solder wetting structure 116 is in the form of a ribbon structure. For example, the solder wetting structure 116 may be implemented as one or more ribbons or round wires 500 metallurgically welded to the metallic surface 104 of the substrate 102 by at least two different wedge stitch bonds 502. The bonding capillary 202 forms a wedge stitch bond 502 by compressing (ultrasonically bonding) an area of the bond wire 124 and the underlying bonding surface 104. FIG. 7 provides an enlarged view of one round wire 500, to emphasize the wedge stitch bonds 502 of the round wire 500. A ribbon may be used instead of a round wire.

According to the embodiments described herein, the solder wetting structure 116 may be ball bonded, wedge bonded, ribbon bonded, or a combination of ball bonded, wedge bonded and/or ribbon bonded to the metallic surface

104 of the substrate 102. The height of the solder wetting structure 116 measured in a direction normal to the substrate 102 depends on various factors, including creepage distance, the die-to-clip downset, etc.

Although the present disclosure is not so limited, the following numbered examples demonstrate one or more aspects of the disclosure.

Example 1. A semiconductor package, comprising: a substrate having a metallic surface; a semiconductor die metallurgically bonded to the metallic surface of the substrate by a first solder joint; and a solder wetting structure metallurgically welded to the metallic surface of the substrate outside a perimeter of the semiconductor die and adjacent to one or more side faces of the semiconductor die, wherein excess solder squeezed out from under the semiconductor die is metallurgically bonded to the solder wetting structure.

Example 2. The semiconductor package of example 1, wherein the excess solder squeezed out from under the semiconductor die has an inhomogeneous profile around the perimeter of the semiconductor die.

Example 3. The semiconductor package of example 1 or 2, wherein the solder wetting structure comprises a plurality of separate bond wires, and wherein each separate bond wire is metallurgically welded to the metallic surface of the substrate at a proximal tail end and has an unattached distal ball end.

Example 4. The semiconductor package of example 3, wherein the separate bond wires are arranged in two or more rows along at least one of the side faces of the semiconductor die.

Example 5. The semiconductor package of any of examples 1 through 4, wherein the solder wetting structure comprises a plurality of separate bond wire loops, and wherein each separate bond wire loop has both a tail end and a ball end metallurgically welded to the metallic surface of the substrate.

Example 6. The semiconductor package of any of examples 1 through 5, wherein the solder wetting structure comprises one or more ribbons or round wires metallurgically welded to the metallic surface of the substrate by at least two different wedge stitch bonds.

Example 7. The semiconductor package of any of examples 1 through 6, wherein the solder wetting structure is adjacent to each side face of the semiconductor die.

Example 8. The semiconductor package of any of examples 1 through 7, wherein the substrate is part of a copper lead frame, and wherein the solder wetting structure comprises copper.

Example 9. The semiconductor package of any of examples 1 through 8, further comprising: an electrically conductive clip attached to a contact pad of the semiconductor die that faces away from the substrate, wherein the solder wetting structure is disposed in a gap between the substrate and the electrically conductive clip, wherein the solder wetting structure prevents the excess solder from bridging the gap.

Example 10. The semiconductor package of example 9, further comprising: a mold compound encapsulating the semiconductor die and at least part of the electrically conductive clip, wherein the solder wetting structure enhances adhesion between the mold compound and the metallic surface of the substrate.

Example 11. The semiconductor package of example 9 or 10, wherein the solder wetting structure is adjacent only to the side face of the semiconductor die that faces the gap.

Example 12. The semiconductor package of example 9 or 10, wherein the solder wetting structure is adjacent to the side face of the semiconductor die that faces the gap and at least one additional side face of the semiconductor die.

Example 13. The semiconductor package of example 1, wherein the solder wetting structure is in the form of a wire or ribbon structure.

Example 14. A method of producing a semiconductor package, the method comprising: metallurgically welding a solder wetting structure to a metallic surface of a substrate outside a die attach area of the metallic surface; and metallurgically bonding a semiconductor die to the die attach area of the metallic surface of the substrate by a first solder joint and such that the solder wetting structure is adjacent to one or more side faces of the semiconductor die, wherein excess solder that squeezes out from under the semiconductor die during production of the semiconductor package is metallurgically bonded to the solder wetting structure.

Example 15. The method of example 14, wherein metallurgically welding the solder wetting structure to the metallic surface of the substrate comprises: forming a free-air ball at a distal end of a plurality of separate bond wires; and metallurgically welding a proximal tail end of the plurality of separate bond wires to the metallic surface of the substrate outside the die attach area of the metallic surface and such that the distal end with the free-air ball remains unattached to the metallic surface of the substrate.

Example 16. The method of example 15, wherein the separate bond wires are metallurgically welded to the metallic surface of the substrate outside the die attach area of the metallic surface in two or more rows.

Example 17. The method of example 14 or 15, wherein metallurgically welding the solder wetting structure to the metallic surface of the substrate comprises: metallurgically welding both a tail end and a ball end of a plurality of separate bond wire loops to the metallic surface of the substrate outside the die attach area of the metallic surface.

Example 18. The method of any of examples 14 through 17, wherein metallurgically welding the solder wetting structure to the metallic surface of the substrate comprises: wedge bonding one or more ribbons or round wires to the metallic surface of the substrate outside the die attach area of the metallic surface.

Example 19. The method of any of examples 14 through 18, further comprising: attaching an electrically conductive clip to a contact pad of the semiconductor die that faces away from the substrate, wherein the solder wetting structure is disposed in a gap between the substrate and the electrically conductive clip, wherein the solder wetting structure prevents the excess solder from bridging the gap during the attaching of the electrically conductive clip to the contact pad of the semiconductor die.

Example 20. The method of example 19, wherein the semiconductor die is metallurgically bonded to the die attach area of the metallic surface of the substrate by a flux-free solder that melts to form the first solder joint, wherein the first solder joint remelts into a liquid solder during the attaching of the electrically conductive clip, and wherein the solder wetting structure prevents excess liquid solder that squeezes out from under the semiconductor die during the attaching of the electrically conductive clip from wetting with the electrically conductive clip.

Example 21. The method of example 20, further comprising: encapsulating the semiconductor die and at least part of the electrically conductive clip in a mold compound, wherein the solder wetting structure enhances adhesion between the mold compound and the metallic surface of the substrate.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a substrate having a metallic surface;
   a semiconductor die metallurgically bonded to the metallic surface of the substrate by a first solder joint; and
   a solder wetting structure metallurgically welded to the metallic surface of the substrate outside a perimeter of the semiconductor die and adjacent to one or more side faces of the semiconductor die,
   wherein the solder wetting structure is configured to metallurgically bond to excess solder squeezed out from under the semiconductor die.

2. The semiconductor package of claim 1, further comprising excess solder squeezed out from under the semiconductor die and metallurgically bonded to the solder wetting structure, wherein the excess solder has an inhomogeneous profile around the perimeter of the semiconductor die.

3. The semiconductor package of claim 1, wherein the solder wetting structure comprises a plurality of separate bond wires, and wherein each separate bond wire is metallurgically welded to the metallic surface of the substrate at a proximal tail end and has an unattached distal ball end.

4. The semiconductor package of claim 3, wherein the separate bond wires are arranged in two or more rows along at least one of the side faces of the semiconductor die.

5. The semiconductor package of claim 1, wherein the solder wetting structure comprises a plurality of separate bond wire loops, and wherein each separate bond wire loop has both a tail end and a ball end metallurgically welded to the metallic surface of the substrate.

6. The semiconductor package of claim 1, wherein the solder wetting structure comprises one or more ribbons or round wires metallurgically welded to the metallic surface of the substrate by at least two different wedge stitch bonds.

7. The semiconductor package of claim 1, wherein the solder wetting structure is adjacent to each of the side faces of the semiconductor die.

8. The semiconductor package of claim 1, wherein the substrate is part of a copper lead frame, and wherein the solder wetting structure comprises copper.

9. The semiconductor package of claim 1, further comprising:
   an electrically conductive clip attached to a contact pad of the semiconductor die that faces away from the substrate,
   wherein the solder wetting structure is disposed in a gap between the substrate and the electrically conductive clip,
   wherein the solder wetting structure is configured to prevent excess solder from bridging the gap.

10. The semiconductor package of claim 9, further comprising:
    a mold compound encapsulating the semiconductor die and at least part of the electrically conductive clip,
    wherein the solder wetting structure enhances locking with the mold compound, thereby enhancing adhesion between the mold compound and the metallic surface of the substrate.

11. The semiconductor package of claim 9, wherein the solder wetting structure is adjacent only to a side face of the semiconductor die that faces the gap.

12. The semiconductor package of claim 9, wherein the solder wetting structure is adjacent to the side face of the semiconductor die that faces the gap and at least one additional side face of the semiconductor die.

13. The semiconductor package of claim 1, wherein the solder wetting structure is in the form of a wire or ribbon structure.

14. A method of producing a semiconductor package, the method comprising:
    metallurgically welding a solder wetting structure to a metallic surface of a substrate outside a die attach area of the metallic surface; and
    metallurgically bonding a semiconductor die to the die attach area of the metallic surface of the substrate by a first solder joint and such that the solder wetting structure is adjacent to one or more side faces of the semiconductor die,
    wherein the solder wetting structure is configured to metallurgically bond to excess solder that squeezes out from under the semiconductor die during production of the semiconductor package.

15. The method of claim 14, wherein metallurgically welding the solder wetting structure to the metallic surface of the substrate comprises:
    forming a free-air ball at a distal end of a plurality of separate bond wires; and
    metallurgically welding a proximal tail end of the plurality of separate bond wires to the metallic surface of the substrate outside the die attach area of the metallic surface and such that the distal end with the free-air ball remains unattached to the metallic surface of the substrate.

16. The method of claim 15, wherein the separate bond wires are metallurgically welded to the metallic surface of the substrate outside the die attach area of the metallic surface in two or more rows.

17. The method of claim 14, wherein metallurgically welding the solder wetting structure to the metallic surface of the substrate comprises:
- metallurgically welding both a tail end and a ball end of a plurality of separate bond wire loops to the metallic surface of the substrate outside the die attach area of the metallic surface.

18. The method of claim 14, wherein metallurgically welding the solder wetting structure to the metallic surface of the substrate comprises:
- wedge bonding one or more ribbons or round wires to the metallic surface of the substrate outside the die attach area of the metallic surface.

19. The method of claim 14, further comprising:
- attaching an electrically conductive clip to a contact pad of the semiconductor die that faces away from the substrate,
- wherein the solder wetting structure is disposed in a gap between the substrate and the electrically conductive clip,
- wherein the solder wetting structure is configured to prevent excess solder from bridging the gap during the attaching of the electrically conductive clip to the contact pad of the semiconductor die.

20. The method of claim 19, wherein forming the first solder joint comprises melting a flux-free solder, wherein the first solder joint remelts into a liquid solder during the attaching of the electrically conductive clip, wherein excess solder squeezes out from under the semiconductor die during the attaching of the electrically conductive clip, and wherein the solder wetting structure prevents the excess solder that squeezes out from under the semiconductor die during the attaching of the electrically conductive clip from wetting with the electrically conductive clip.

21. The method of claim 20, further comprising:
- encapsulating the semiconductor die and at least part of the electrically conductive clip in a mold compound,
- wherein the solder wetting structure enhances adhesion between the mold compound and the metallic surface of the substrate.

22. The semiconductor package of claim 1, wherein the substrate is a metal substrate.

23. The semiconductor package of claim 1, wherein the metallic surface of the substrate is a metalized surface of an electrically insulative body.

\* \* \* \* \*